United States Patent
Yilmaz et al.

(10) Patent No.: US 10,659,044 B2
(45) Date of Patent: May 19, 2020

(54) ON-DISPLAY-SENSOR STACK

(71) Applicant: ATMEL CORPORATION, Chandler, AZ (US)

(72) Inventors: Esat Yilmaz, Santa Cruz, CA (US); David Brent Guard, Hampshire (GB)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/369,958

(22) Filed: Mar. 29, 2019

(65) Prior Publication Data

US 2019/0229729 A1 Jul. 25, 2019

Related U.S. Application Data

(62) Division of application No. 13/351,903, filed on Jan. 17, 2012, now abandoned.

(51) Int. Cl.
*H03K 17/96* (2006.01)
*G06F 3/044* (2006.01)

(52) U.S. Cl.
CPC ......... *H03K 17/9622* (2013.01); *G06F 3/044* (2013.01); *G06F 2203/04103* (2013.01); *H03K 2217/96031* (2013.01); *H03K 2217/960755* (2013.01)

(58) Field of Classification Search
CPC ... H03K 17/9622; H03K 2217/960755; H03K 2217/96031; G06F 3/044; G06F 2203/04103
See application file for complete search history.

(56) References Cited

U.S. PATENT DOCUMENTS

| | | |
|---|---|---|
| 4,290,061 A | 9/1981 | Serrano |
| 5,122,787 A | 6/1992 | Fujita |
| 5,418,551 A | 5/1995 | Ise |
| 6,501,529 B1 | 12/2002 | Kurihara |
| 7,463,246 B2 | 12/2008 | Mackey |
| 7,663,607 B2 | 2/2010 | Hotelling |
| 7,864,503 B2 | 1/2011 | Chang |
| 7,875,814 B2 | 1/2011 | Chen |
| 7,920,129 B2 | 4/2011 | Hotelling |
| 8,031,094 B2 | 10/2011 | Hotelling |
| 8,031,174 B2 | 10/2011 | Hamblin |
| 8,040,326 B2 | 10/2011 | Hotelling |
| 8,049,732 B2 | 11/2011 | Hotelling |
| 8,134,535 B2 | 3/2012 | Choi |

(Continued)

FOREIGN PATENT DOCUMENTS

WO 2012/129247 9/2012

OTHER PUBLICATIONS

Myers, S. A. et al., "Electronic Devices With Concave Displays," U.S. Appl. No. 61/454,936, filed Mar. 21, 2011, 23 pages.

(Continued)

*Primary Examiner* — Kent W Chang
*Assistant Examiner* — Andrew Lee
(74) *Attorney, Agent, or Firm* — Banner & Witcoff, Ltd.

(57) ABSTRACT

In one embodiment, an electronic display includes a display stack including one or more layers; and drive or sense electrodes of a touch sensor substantially disposed on one or more of the layers on or within the display stack. The drive or sense electrodes are made of a conductive mesh of conductive material.

12 Claims, 5 Drawing Sheets

(56) References Cited

U.S. PATENT DOCUMENTS

| | | | |
|---|---|---|---|
| 8,179,381 | B2 | 5/2012 | Frey |
| 8,184,107 | B2 | 5/2012 | Lee |
| 8,217,902 | B2 | 7/2012 | Chang et al. |
| 8,243,027 | B2 | 8/2012 | Hotelling |
| 2005/0083307 | A1* | 4/2005 | Aufderheide ........... G06F 3/044 345/173 |
| 2008/0007533 | A1 | 1/2008 | Hotelling |
| 2008/0062139 | A1 | 3/2008 | Hotelling et al. |
| 2008/0062148 | A1 | 3/2008 | Hotelling et al. |
| 2008/0158173 | A1 | 7/2008 | Hamblin et al. |
| 2008/0309635 | A1 | 12/2008 | Matsuo |
| 2009/0086113 | A1* | 4/2009 | Ko ..................... G02F 1/13338 349/12 |
| 2009/0219257 | A1* | 9/2009 | Frey ........................ G06F 3/044 345/173 |
| 2009/0256818 | A1 | 10/2009 | Noguchi et al. |
| 2009/0315854 | A1 | 12/2009 | Matuso |
| 2010/0238134 | A1 | 9/2010 | Day et al. |
| 2010/0302202 | A1 | 12/2010 | Takeuchi et al. |
| 2011/0074729 | A1 | 3/2011 | Im et al. |
| 2011/0128254 | A1 | 6/2011 | Teranishi et al. |
| 2011/0157086 | A1 | 6/2011 | Ozeki et al. |
| 2011/0210941 | A1 | 9/2011 | Reynolds et al. |
| 2011/0261005 | A1 | 10/2011 | Joharapurkar et al. |
| 2011/0267295 | A1 | 11/2011 | Noguchi et al. |
| 2011/0267305 | A1 | 11/2011 | Shahparnia et al. |
| 2011/0285661 | A1 | 11/2011 | Hotelling |
| 2012/0013565 | A1 | 1/2012 | Westhues et al. |
| 2012/0056835 | A1 | 3/2012 | Choo et al. |
| 2012/0057312 | A1* | 3/2012 | Yoo ........................ G06F 3/041 361/749 |
| 2012/0062511 | A1 | 3/2012 | Ishikazi et al. |
| 2012/0081300 | A1* | 4/2012 | Chan ........................ G06F 3/044 345/173 |
| 2012/0113027 | A1 | 5/2012 | Song et al. |
| 2012/0242588 | A1 | 9/2012 | Myers et al. |
| 2012/0242592 | A1 | 9/2012 | Rothkopf et al. |
| 2012/0243151 | A1 | 9/2012 | Lynch |
| 2012/0243719 | A1 | 9/2012 | Franklin et al. |
| 2013/0056243 | A1 | 3/2013 | Kim et al. |
| 2013/0076612 | A1 | 3/2013 | Myers |

OTHER PUBLICATIONS

Lynch, S. B., "Electronic Devices With Convex Displays," U.S. Appl. No. 61/454,950, filed Mar. 21, 2011, 28 pages.

Rothkopf, F. R. et al., "Electronic Devices With Flexible Displays," U.S. Appl. No. 61/454,894, filed Mar. 21, 2011, 41 pages.

Yilmaz, E. et al., Non-Final Rejection, U.S. Appl. No. 13/251,093, dated Sep. 20, 2013, 13 pages.

Yilmaz, E. et al., Amendment after Non-Final Rejection, U.S. Appl. No. 13/251,093, dated Dec. 20, 2013, 9 pages.

Yilmaz, E. et al., Final Rejection, U.S. Appl. No. 13/251,093, dated Feb. 11, 2014, 16 pages.

Yilmaz, E. et al., Response after Final Rejection, U.S. Appl. No. 13/251,093, dated Aug. 10, 2014, 11 pages.

Yilmaz, E. et al., Non-Final Rejection, U.S. Appl. No. 13/251,093, dated Sep. 19, 2014, 17 pages.

Yilmaz, E. et al., Amendment after Non-Final Rejection, U.S. Appl. No. 13/251,093, dated Feb. 19, 2015, 12 pages.

Yilmaz, E. et al., Final Rejection, U.S. Appl. No. 13/251,093, dated Jun. 18, 2015, 20 pages.

Yilmaz, E. et al., Response after Final Rejection, U.S. Appl. No. 13/251,093, dated Dec. 17, 2015, 14 pages.

Yilmaz, E. et al., Non-Final Rejection, U.S. Appl. No. 13/251,093, dated Apr. 8, 2016, 22 pages.

Yilmaz, E. et al, Amendment after Non-Final Rejection, U.S. Appl. No. 13/251,093, dated Aug. 8, 2016, 16 pages.

Yilmaz, E. et al., Final Rejection, U.S. Appl. No. 13/251,093, dated Sep. 23, 2016, 20 pages.

Yilmaz, E. et al., Response after Final Rejection, U.S. Appl. No. 13/251,093, dated Jan. 23, 2017, 17 pages.

Yilmaz, E. et al., Non-Final Rejection, U.S. Appl. No. 13/251,093, dated Feb. 24, 2017, 23 pages.

Yilmaz, E. et al., Amendment after Non-Final Rejection, U.S. Appl. No. 13/251,093, dated Aug. 24, 2017, 23 pages.

Yilmaz, E. et al., Final Rejection, U.S. Appl. No. 13/251,093, dated Nov. 29, 2017, 24 pages.

Yilmaz, E. et al., Response after Final Rejection, U.S. Appl. No. 13/251,093, dated Jan. 26, 2018, 12 pages.

Yilmaz, E. et al., Advisory Action, U.S. Appl. No. 13/251,093, dated Feb. 7, 2018, 3 pages.

Yilmaz, E. et al., RCE, U.S. Appl. No. 13/251,093, dated Feb. 8, 2018, 1 page.

Yilmaz, E. et al., Non-Final Rejection, U.S. Appl. No. 13/251,093, dated Mar. 22, 2018, 23 pages.

Yilmaz, E. et al., Amendment after Non-Final Rejection, U.S. Appl. No. 13/251,093, dated Jun. 21, 2018, 12 pages.

Yilmaz, E. et al., Final Rejection, U.S. Appl. No. 13/251,093, dated Nov. 1, 2018, 19 pages.

* cited by examiner

ON-DISPLAY-SENSOR STACK

RELATED APPLICATION

This application is a divisional under 35 U.S.C. § 120 of U.S. application Ser. No. 13/351,903, filed Jan. 17, 2012 and entitled On-Display-Sensor Stack, incorporated herein by reference.

TECHNICAL FIELD

This disclosure generally relates to touch sensors.

BACKGROUND

A touch sensor may detect the presence and location of a touch or the proximity of an object (such as a user's finger or a stylus) within a touch-sensitive area of the touch sensor overlaid on a display screen, for example. In a touch-sensitive display application, the touch sensor may enable a user to interact directly with what is displayed on the screen, rather than indirectly with a mouse or touchpad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are different types of touch sensors, such as (for example) resistive touch screens, surface acoustic wave touch screens, and capacitive touch screens. Herein, reference to a touch sensor may encompass a touch screen, and vice versa, where appropriate. A capacitive touch screen may include an insulator coated with a substantially transparent conductor in a particular pattern. When an object touches or comes within proximity of the surface of the capacitive touch screen, a change in capacitance may occur within the touch screen at the location of the touch or proximity. A controller may process the change in capacitance to determine its position on the touch screen.

DESCRIPTION OF EXAMPLE EMBODIMENTS

Figure 1:
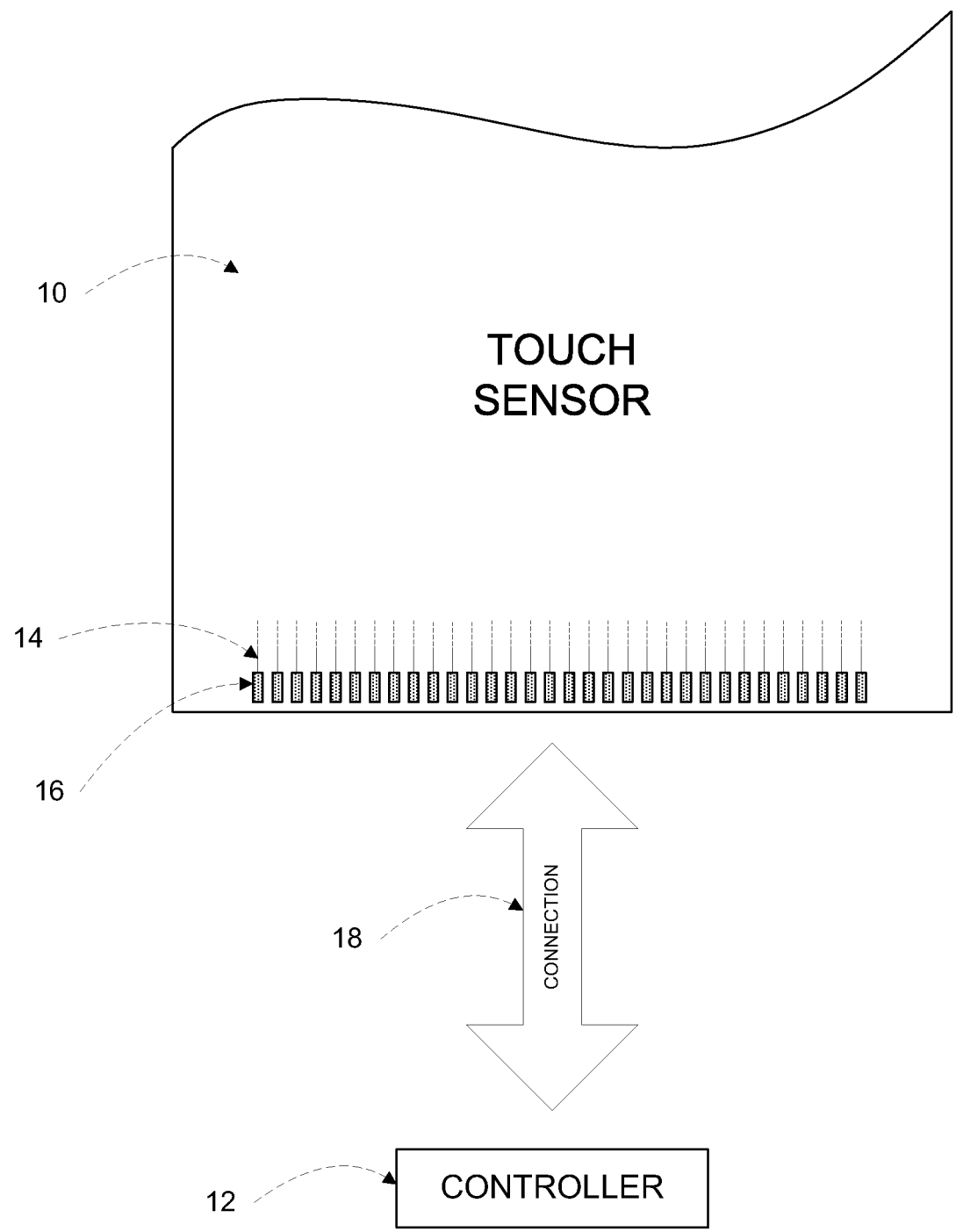
FIG. 1 illustrates an example touch sensor with an example controller.

FIG. 1 illustrates an example touch sensor 10 with an example controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. In particular embodiments, the touch-sensitive areas of touch sensor 10 may be defined by the array of drive and sense electrodes. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a drive electrode or a sense electrode) may be an area of conductive material forming a shape, such as for example a disc, square, rectangle, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape, where appropriate. In particular embodiments, the conductive material of an electrode may occupy substantially less than 100% of the area of its shape. As an example and not by way of limitation, an electrode may be made of fine lines of metal or other conductive material (such as for example carbon nanotubes, copper, silver, or a copper- or silver-based material) and the fine lines of conductive material may occupy substantially less than 100% of the area of its shape in a hatched, mesh, or other suitable pattern. Although this disclosure describes or illustrates particular electrodes made of particular conductive material forming particular shapes with particular fills having particular patterns, this disclosure contemplates any suitable electrodes made of any suitable conductive material forming any suitable shapes with any suitable fills having any suitable patterns. Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate (PC), or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 millimeter (mm); the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses.

One or more portions of the substrate of touch sensor 10 may be made of PET or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness within a range between approximately 1 and approximately 5 microns (μm) and a width within a range between approximately 1 and approximately 10 μm. As another example, one or more portions of the conductive material may be silver or silver-based and similarly have a thickness of approximately 1 and approximately 5 μm and a width of approximately 1 and approximately 10 μm. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. In particular embodiments, the drive and sense electrodes define the touch-sensitive area of touch sensor 10. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs) or digital signal processors (DSPs)) of a device that includes touch sensor 10 and touch-sensor controller 12, which may respond to the touch or proximity input by initiating a function of the device (or an application running on the device) associated with it. Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. The FPC may be active or passive. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 μm or less. As another example, the conductive material of tracks 14 may be silver or silver-based and have a width of approximately 100 μm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

Figure 2:
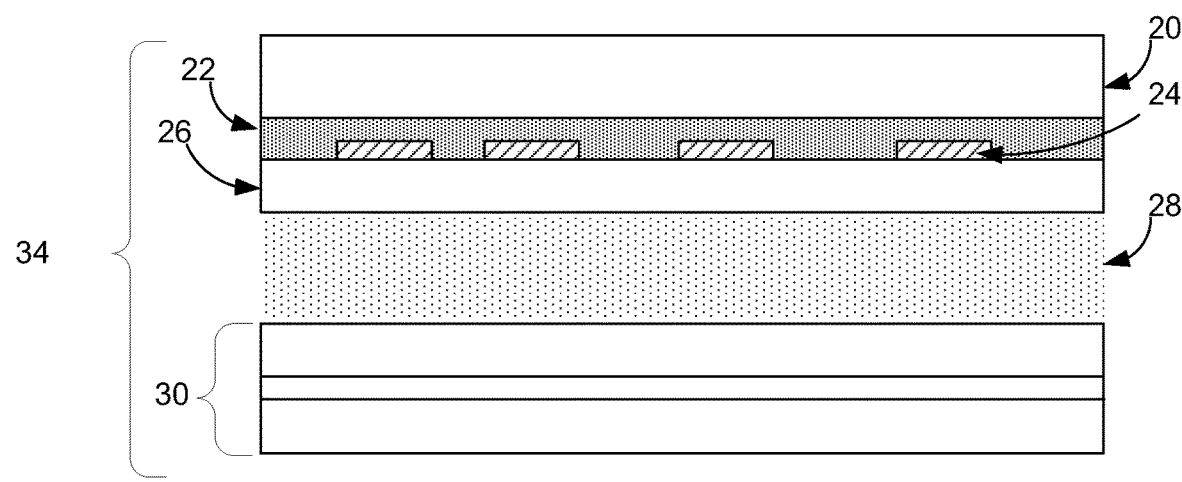
FIG. 2 illustrates an example cross-section of an example mechanical stack.

FIG. 2 illustrates an example cross-section of an example mechanical stack. Although this disclosure describes particular mechanical stack configurations with a particular number of particular layers made of particular materials and having particular thicknesses, this disclosure contemplates any suitable mechanical stack configuration with any suitable number of any suitable layers made of any suitable materials and having any suitable thicknesses. A mechanical stack 34 includes a substrate 26 with conductive material 24 forming the drive and sense electrodes of the touch sensor. One or more portions of substrate 26 may be made of PET, glass, PC, PMMA, FR-4, or another suitable material, and this disclosure contemplates any suitable substrate made of any suitable material. In particular embodiments, mechanical stack 34 includes an adhesive layer 22 disposed between cover panel 20 and substrate 26 with conductive material 24. As an example and not by way of limitation, adhesive layer 22 is an OCA. As described above, cover panel 20 is made of substantially transparent material, such as for example glass, PC, or PMMA, and this disclosure contemplates any suitable cover panel made of any suitable material. A dielectric layer 28 is disposed between a bottom surface of substrate 26 with conductive material 24 and a display 30 of a device. In particular embodiments, display 30 includes a display stack with its own structure and with one or more layers that have functions independent of the other layers (e.g. 22 and 26) of mechanical stack 34, such as for example presenting an image to a user, as described below.

Conductive material 24 forming the drive and sense electrodes may be an area of conductive material 24 that forms a shape, such as for example a disc, square, rectangle, other suitable shape, or suitable combination of these, disposed on a surface of substrate 26. As an example and not by way of limitation, conductive material 24 of an electrode is made from a conductive mesh of fine lines of conductive material 24 (such as for example carbon nanotubes, gold, aluminum, copper, silver, or copper- or silver-based material) or other conductive material and the fine lines of conductive material 24 occupies a range of approximately 1 to approximately 10% of the area of its shape in a hatched or other suitable pattern. As another example, the conductive mesh substantially covers an entire touch-sensitive area of the touch sensor. In particular embodiments, conductive material 24 is opaque. Although the fine lines of conductive material 24 are opaque, the combined optical transmissivity of electrodes formed using a conductive mesh is approximately 90% or higher, ignoring a reduction in transmittance due to other factors such as the substantially flexible substrate material. Thus, the contribution of the fine lines of conductive material 24 to the attenuation of light through the conductive mesh may be within a range of approximately 1 to approximately 10%. In other particular embodiments, the electrodes, tracking, and bond pads of the touch sensor are all formed from conductive material 24. This disclosure contemplates lines of conductive material that follow any variation of line direction or path from a straight line, including, but not limited to, wavy lines or zig-zag lines.

As described above, a dielectric layer 28 is disposed between substrate 26 and a display 30 of a device. As an example and not by way of limitation, dielectric layer 28 is an air gap. As an another example, dielectric layer 28 is a second OCA layer. As an example and not by way of limitation, cover panel 20 has a thickness of approximately 1 mm; the first OCA layer 22 has a thickness of approximately 0.05 mm; the substrate 26 with the conductive material 24 forming the drive and sense electrodes has a thickness of approximately 0.05 mm (including the conductive material 24 forming the drive and sense electrodes); and the dielectric layer 28 has a thickness of approximately 0.05 mm.

Figure 3:
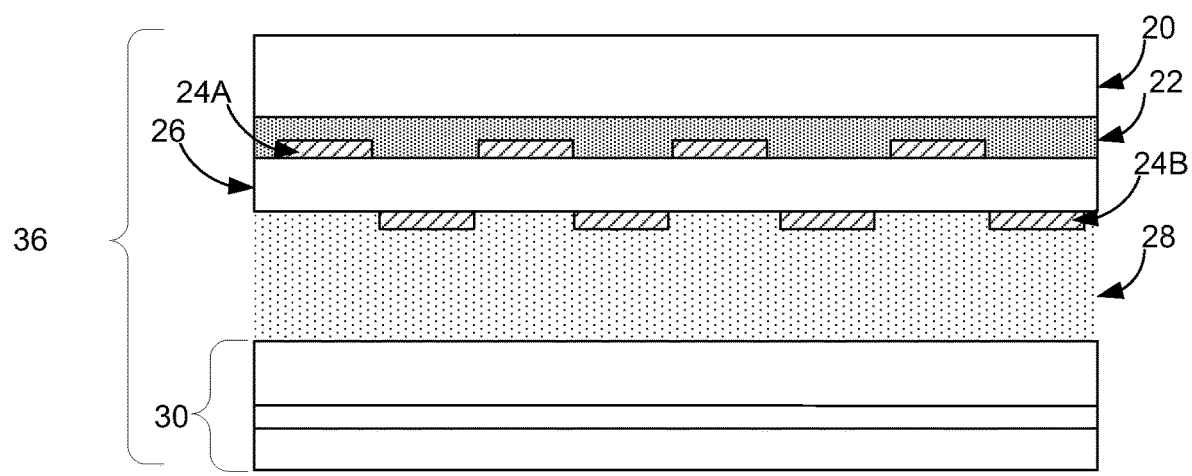
FIG. 3 illustrates another example cross-section of an example mechanical stack.

FIG. 3 illustrates an example a cross-section of an example two-layer substrate mechanical stack. In the example of FIG. 3, substrate 26 of mechanical stack 36 has conductive material 24A-B forming drive or sense electrodes of a touch-sensor disposed on opposing surfaces of substrate 26. As described above, OCA layer 22 is disposed between cover panel 20 and the top surface of substrate 26 with electrodes formed from conductive material 24A. A dielectric layer 28 is disposed between a bottom surface of substrate 26 with conductive material 24B and a display 30 of a device. In particular embodiments, electrodes formed from conductive material 24A-B substantially covers the entire touch-sensitive area on both sides of substrate 26. As described above, electrodes is made of fine lines of conductive material 24A-B and the fine lines of conductive material 24A-B occupies a portion of the area of the electrodes in a hatched or other suitable pattern. In particular embodiments, dielectric layer 28 is an adhesive layer. As an example and not by way of limitation, dielectric layer 28 is an OCA or UV-cured material, such as for example, a liquid OCA (LOCA) layer. In other particular embodiments, dielectric layer 28 includes layers of OCA and PET and an air gap.

Figure 4:
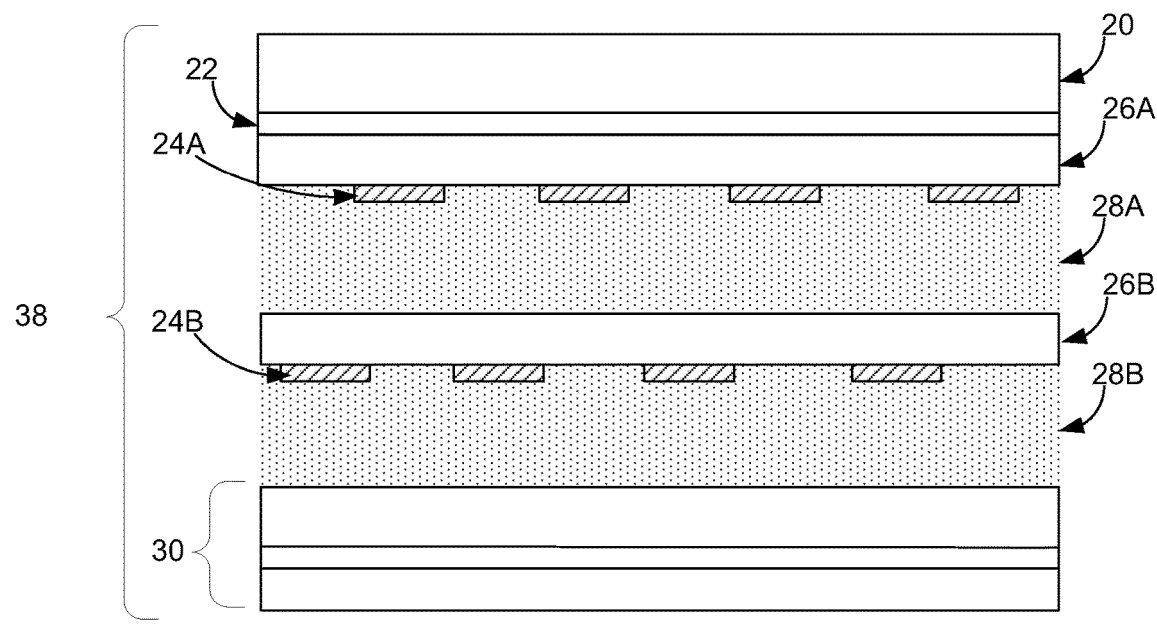
FIG. 4 illustrates another example cross-section of an example mechanical stack.

FIG. 4 illustrates an example dual-substrate mechanical stack. In the example of FIG. 4, mechanical stack 38 may have drive electrodes and sense electrodes of the touch sensor disposed on separate substrates 26A-B. In particular embodiments, conductive material 24A of one set of electrodes (i.e. drive or sense) for a two-layer touch-sensor configuration is disposed on a surface of substrate 26A and conductive material 24B of another set of electrodes is disposed on a surface of substrate 26B. As described above, electrodes is made of fine lines of conductive material 24A-B and the fine lines of conductive material 24A-B occupies a portion of the area of the electrodes in a hatched or other suitable pattern.

Mechanical stack 38 includes an adhesive layer 22 disposed between cover panel 20 and substrate 26A. As an example and not by way of limitation, adhesive layer 22 is an OCA layer. An adhesive layer 28A is disposed between the bottom surface of substrate 26A with conductive material 24A and the top surface of substrate 24B and another adhesive layer 28B between the bottom surface of substrate 26B with conductive material 24B and display 30 of the device. As an example and not by way of limitation, adhesive layers 28A-B are OCA layers. As an another example, adhesive layer 28A is an OCA layer and adhesive layer 28B has OCA and PET layers, and air gap. In particular embodiments, substrates 24A-B are oriented such that the drive and sense electrodes of the touch sensor are facing or oriented toward display 30.

Figure 5:
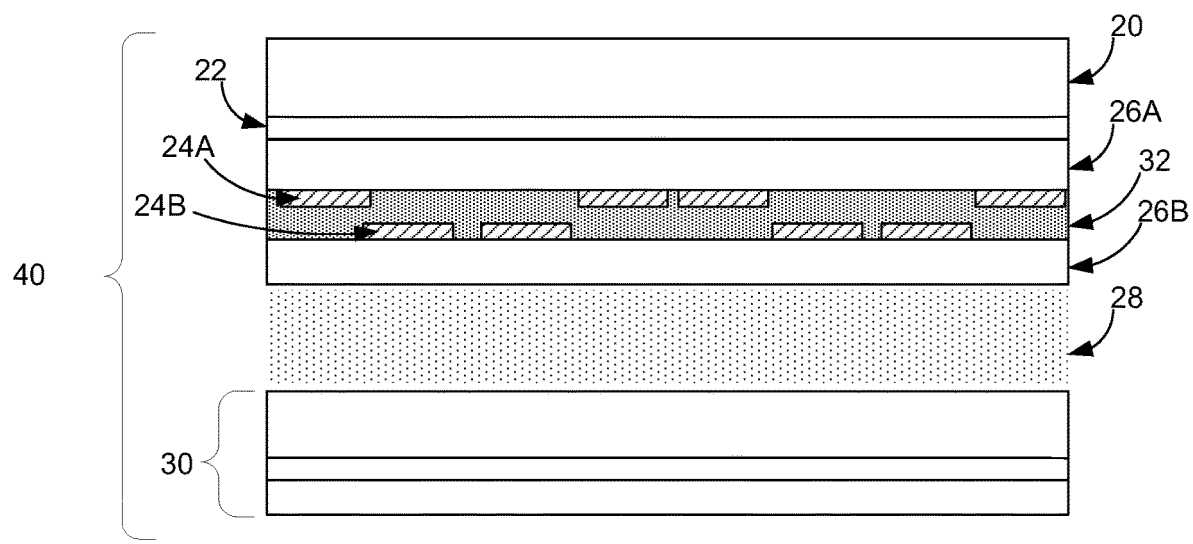
FIG. 5 illustrates another example cross-section of an example mechanical stack.

FIG. 5 illustrates an example dual-substrate mechanical stack with opposing electrodes. In the example of FIG. 5, mechanical stack 40 has drive electrodes and sense electrodes of the touch sensor disposed on separate substrates 26A-B. In particular embodiments, conductive material 24A of one set of electrodes (i.e. drive or sense) for a two-layer touch-sensor configuration is disposed on a surface of substrate 26A and conductive material 24B of another set of electrodes is disposed on a surface of substrate 26B. As an example and not by way of limitation, the conductive mesh substantially covers an entire touch-sensitive area of the touch sensor defined by the electrodes. In other particular embodiments, substrates 24A-B are oriented such that the drive and sense electrodes of the touch sensor are oriented toward or facing each other. Mechanical stack 40 includes an adhesive layer 22 disposed between cover panel 20 and the top surface of substrate 26A. As an example and not by way of limitation, adhesive layer 22 is an OCA layer. Adhesive layer 32 is disposed between conductive material 24A (which is disposed on substrate 26A) and conductive material 24B (which is disposed on substrate 26B). In particular embodiments adhesive layer 32 is a UV-cured material, such as for example LOCA. In other particular embodiments, dielectric layer 32 is an OCA. Mechanical stack 40 also includes a dielectric layer 28 is disposed between a bottom surface of substrate 26B and a display 30 of the device. As an example and not by way of limitation, dielectric layer 28 is an adhesive layer, such as for example an OCA layer. As another example, dielectric layer 28 is an air gap.

Figure 6A:
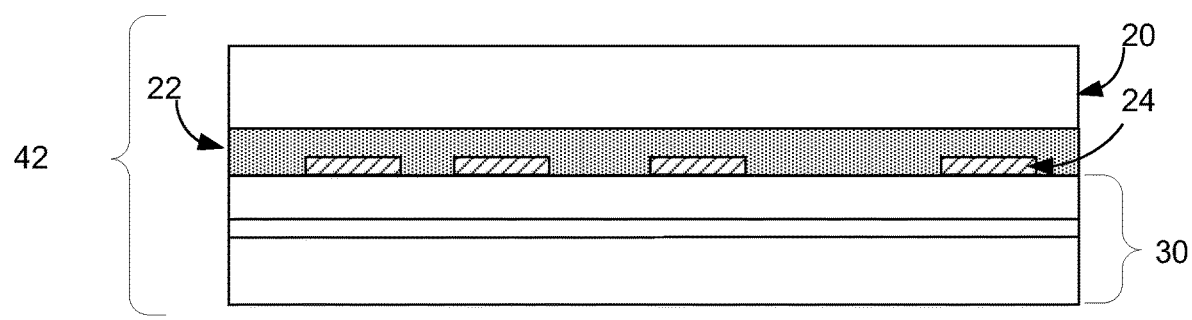
FIGS. 6A-B illustrate another example cross-section of an example mechanical stack.
Figure 6B:
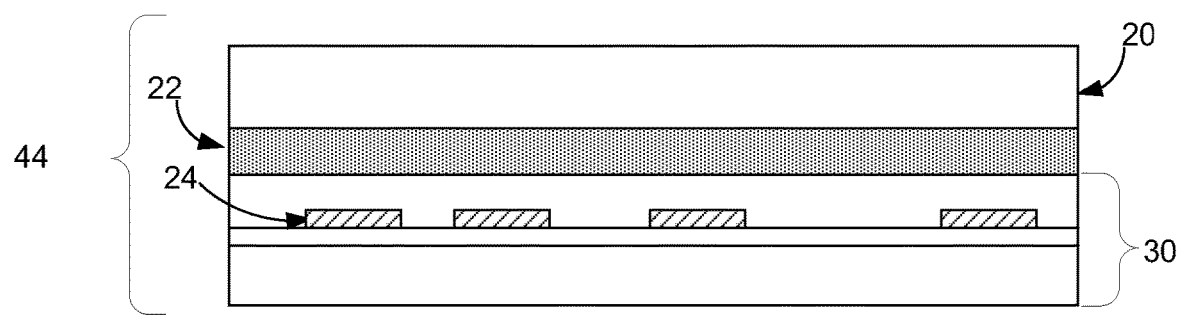

FIGS. 6A-B illustrate an example mechanical stack with a touch sensor disposed on a display stack. As described above, display 30 includes one or more layers associated with displaying an image to a user. As an example and not by way of limitation, display stack of display 30 may include a layer with elements that apply signals to pixels of display 30 and a cover layer. In the example of FIG. 6A, conductive material 24 forming the drive electrodes and sense electrodes of the touch sensor is disposed on the cover layer of the display stack, such that display 30 functions as the substrate for conductive material 24. Mechanical stack 42 includes an adhesive layer 22, such as for example a LOCA layer, disposed between cover panel 20 and display 30.

In the example of FIG. 6B, conductive material 24 forming the drive electrodes and sense electrodes of the touch sensor is disposed within the display stack of display 30, such that a layer of the display stack, other than the cover layer, functions as the substrate, or substrate layer, for conductive material 24. In particular embodiments, display stack of display 30 may include one or more layers with an optical function that modifies an optical property of light originating underneath the substrate layer. Conductive material 24 may be disposed on a layer of the display stack with an optical function that modifies an optical property of light originating underneath that substrate layer. As an example and not by way of limitation, display stack of display 30 may include a layer that polarizes light originating underneath that layer, i.e. a polarizer layer, and conductive material 24 may be disposed on the polarizer layer. As another example, a layer of display stack of display 30 may attenuate particular color components of light originating underneath that layer, i.e. a color filter layer, and conductive material 24 may be disposed on the color filter layer. Conductive material 24 may be situated between the remaining layers of the display stack, such as for example the cover layer of the display stack, and the layer of the display stack on which conductive material 24 is disposed, such as for example the polarizer layer. Mechanical stack 44 includes adhesive layer 22, such as for example a LOCA layer, disposed between cover panel 20 and display 30.

Figure 7:
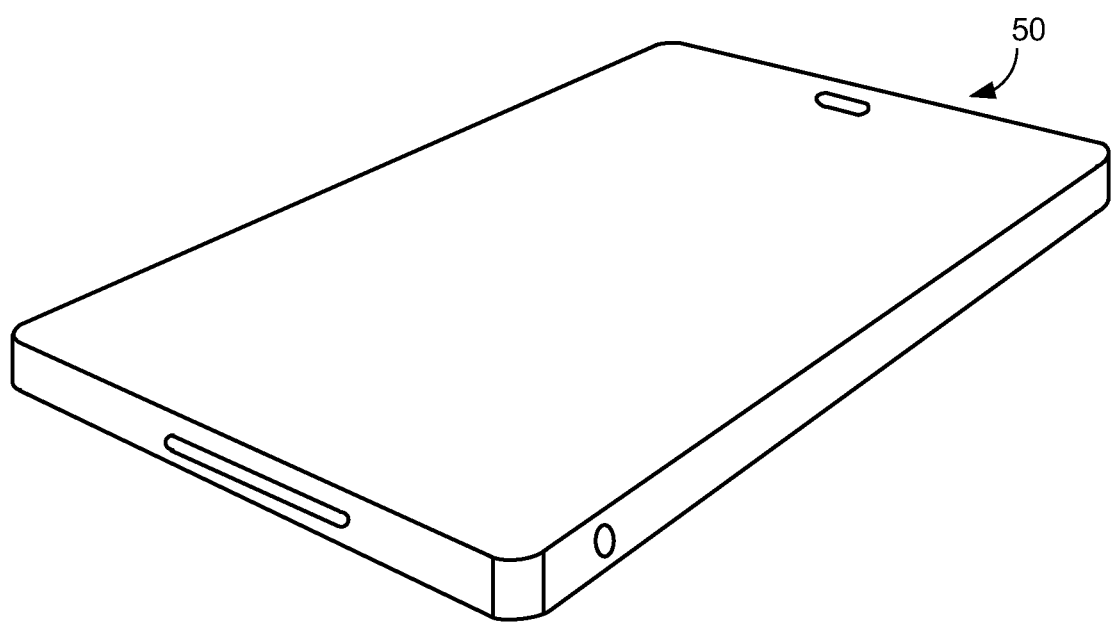
FIG. 7 illustrates an example device incorporating a touch sensor on a mechanical stack.

FIG. 7 illustrates an example device incorporating a touch sensor disposed on a mechanical stack. As described above, examples of device 50 include a smartphone, a PDA, a tablet computer, a laptop computer, a desktop computer, a kiosk computer, a satellite navigation device, a portable media player, a portable game console, a point-of-sale device, another suitable device, a suitable combination of two or more of these, or a suitable portion of one or more of these. In the example of FIG. 7, device 50 includes a touch sensor implemented using a mechanical stack and a display underneath the touch sensor. The one or more substrates of the mechanical stack includes or have attached to it tracking areas, which includes tracks providing drive and sense connections to and from the drive and sense electrodes of the touch sensor. As described above, an electrode pattern of touch sensor made from a conductive mesh using carbon nanotubes, gold, aluminum, copper, silver, or other suitable conductive material. A user of device 50 may interact with device 50 through the touch sensor implemented on a mechanical stack described above. As an example and not by way of limitation, the user interacts with the device by touching the touch-sensitive area of the touch sensor.

Herein, reference to a computer-readable storage medium may include a semiconductor-based or other IC (such, as for example, a field-programmable gate array (FPGA) or an ASIC), a hard disk drive (HDD), a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, another suitable computer-readable storage medium, or a suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An electronic display comprising:
a display stack comprising a plurality of layers, the plurality of layers comprising a cover layer; and
a plurality of electrodes of a touch sensor disposed on one or more of the plurality of layers of the display stack other than the cover layer of the display stack, the plurality of electrodes being made of a conductive mesh of conductive material such that each of the plurality of electrodes comprises multiple conductive lines of the conductive mesh formed in a mesh, wherein:
the one or more of the plurality of layers of the display stack on which the plurality of electrodes are disposed comprises a first layer within the display stack;
the plurality of electrodes comprise first electrodes disposed on the first layer within the display stack on a first side of the first layer and second electrodes disposed on the first layer within the display stack on a second side of the first layer such that the first electrodes and the second electrodes directly contact the first layer, the first layer being a single substrate made of a same material;
the first layer within the display stack on which the first and second electrodes are disposed comprises a polarizer layer;
the first electrodes disposed on the first layer within the display stack on the first side of the first layer are positioned nearer to the cover layer of the display stack than the first layer within the display stack on which the first electrodes are disposed; and
the second electrodes disposed on the second side of the first layer within the display stack comprise one or more electrodes configurable to operate as sense electrodes.

2. The electronic display of claim 1, wherein at least one of the plurality of layers of the display stack has an optical function modifying an optical property of light.

3. The electronic display of claim 2, wherein the optical function comprises one or more of:
color filtering; and
polarization.

4. The electronic display of claim 1, wherein each of the multiple conductive lines of the conductive mesh has a width within a range of approximately 1 to approximately 10 μm.

5. The electronic display of claim 1, wherein a contribution of the multiple conductive lines of the conductive mesh to an attenuation of light through the conductive mesh is within a range of approximately 1 to approximately 10%.

6. The electronic display of claim 1, wherein the conductive mesh substantially covers an entire touch-sensitive area of the touch sensor disposed on one or more of the layers.

7. The electronic display of claim 1, wherein the conductive material comprises at least one of gold, aluminum, copper, silver, and carbon.

8. The electronic display of claim 1, wherein the electrodes, a track, and a connection pad of the touch sensor are formed from a same conductive material.

9. An electronic display comprising:
a display stack comprising a plurality of layers, the plurality of layers comprising a cover layer; and
a plurality of electrodes of a touch sensor disposed on one or more of the plurality of layers of the display stack other than the cover layer of the display stack, wherein:
the one or more of the plurality of layers of the display stack on which the plurality of electrodes are disposed comprises a first layer within the display stack;
the plurality of electrodes comprise first electrodes disposed on the first layer within the display stack on a first side of the first layer and second electrodes disposed on the first layer within the display stack on a second side of the first layer such that the first electrodes and the second electrodes directly contact the first layer, the first layer being a single substrate made of a same material;
the first electrodes disposed on the first layer within the display stack on the first side of the first layer are positioned nearer to the cover layer of the display stack than the first layer within the display stack on which the first electrodes are disposed; and
the second electrodes disposed on the second side of the first layer within the display stack comprise one or more electrodes configurable to operate as sense electrodes.

10. The electronic display of claim 9, wherein at least one of the plurality of layers of the display stack has an optical function modifying an optical property of light.

11. The electronic display of claim 10, wherein the optical function comprises one or more of:
color filtering; and
polarization.

12. The electronic display of claim 9, wherein the electrodes, a track, and a connection pad of the touch sensor are formed from a same conductive material.

* * * * *